(12) United States Patent
Okada

(10) Patent No.: US 10,044,169 B2
(45) Date of Patent: Aug. 7, 2018

(54) OPTICAL COMPONENT AND ITS METHOD OF MANUFACTURE, AND LIGHT EMITTING DEVICE AND ITS METHOD OF MANUFACTURE

(71) Applicant: NICHIA CORPORATION, Anan-shi, Tokushima (JP)

(72) Inventor: Takeshi Okada, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/705,640

(22) Filed: Sep. 15, 2017

(65) Prior Publication Data

US 2018/0006430 A1 Jan. 4, 2018

Related U.S. Application Data

(63) Continuation of application No. 15/344,641, filed on Nov. 7, 2016, now Pat. No. 9,793,680, which is a continuation of application No. 14/868,809, filed on Sep. 29, 2015, now Pat. No. 9,490,606.

(30) Foreign Application Priority Data

Sep. 30, 2014 (JP) ................. 2014-202178

(51) Int. Cl.
*H01S 5/00* (2006.01)
*H01S 5/022* (2006.01)
*H01S 5/024* (2006.01)
*H01S 5/323* (2006.01)

(52) U.S. Cl.
CPC .......... *H01S 5/02296* (2013.01); *H01S 5/022* (2013.01); *H01S 5/02469* (2013.01); *H01S 5/02212* (2013.01); *H01S 5/32341* (2013.01)

(58) Field of Classification Search
CPC .. H01S 5/022; H01S 5/02296; H01S 5/02212; H01S 5/02469; H01S 5/32341
See application file for complete search history.

(56) References Cited

U.S. PATENT DOCUMENTS

| 6,426,591 B1 * | 7/2002 | Yanagisawa | ......... G02B 6/4204 257/E31.117 |
|---|---|---|---|
| 2008/0049800 A1 | 2/2008 | Hasegawa et al. | |
| 2008/0075406 A1 * | 3/2008 | Kadomi | ................. G02B 6/262 385/79 |
| 2008/0116473 A1 * | 5/2008 | Sugiyama | ............. H01L 33/483 257/98 |
| 2014/0160759 A1 * | 6/2014 | Hayashi | ............. H01S 5/02212 362/259 |

FOREIGN PATENT DOCUMENTS

| EP | 2743998 A1 | 6/2014 |
|---|---|---|
| JP | 2002-270943 A | 9/2002 |

(Continued)

*Primary Examiner* — Kinam Park

(57) ABSTRACT

An optical component includes a support member having a through-hole, a second light-transmissive member disposed inside the through-hole, and having a light incidence face, a light emission face, and an outer peripheral side surface, and at least one functional film selected from a group consisting of a short pass filter, a long pass filter, and a heat dissipation member and disposed on a surface of the second light-transmissive member.

19 Claims, 6 Drawing Sheets

(56) References Cited

FOREIGN PATENT DOCUMENTS

| | | |
|---|---|---|
| JP | 2003-283034 A | 10/2003 |
| JP | 2008-076798 A | 4/2008 |
| JP | 2008-153617 A | 7/2008 |
| JP | 2008-305936 A | 12/2008 |
| JP | 2009-260053 A | 11/2009 |
| JP | 2009-272576 A | 11/2009 |
| JP | 2010-199357 A | 9/2010 |

* cited by examiner

OPTICAL COMPONENT AND ITS METHOD OF MANUFACTURE, AND LIGHT EMITTING DEVICE AND ITS METHOD OF MANUFACTURE

CROSS-REFERENCE TO RELATED APPLICATIONS

This is a continuation application of U.S. patent application Ser. No. 15/344,641, filed on Nov. 7, 2016, which is a continuation application of U.S. patent application Ser. No. 14/868,809 filed on Sep. 29, 2015. This application claims priority to Japanese Patent Application No. 2014-202178 filed on Sep. 30, 2014. The entire disclosures of U.S. patent application Ser. Nos. 15/344,641 and 14/868,809 and Japanese Patent Application No. 2014-202178 are hereby incorporated herein by reference.

BACKGROUND

1. Field of the Invention

The present disclosure relates to an optical component and its method of manufacture, and to a light emitting device and its method of manufacture.

2. Description of Related Art

Light emitting devices in which LEDs, laser diodes and the like are used as the light source have been proposed (See EP2743998A, JP2009-260053A and JP2009-272576A). These light emitting devices have an optical component that includes a support member with a through-hole, and a light-transmissive member disposed in the through-hole. The light from the light source is emitted via the light-transmissive member. Also, light extraction efficiency is improved by providing a reflective film to the support member.

SUMMARY

One object of the present disclosure is to provide an optical component that affords higher output and brightness, and a method for manufacturing this optical component, as well as a light emitting device that makes use of this optical component, and a method for manufacturing this device.

An optical component includes a support member having a through-hole, a second light-transmissive member disposed inside the through-hole, and having a light incidence face, a light emission face, and an outer peripheral side surface, and at least one functional film selected from a group consisting of a short pass filter, a long pass filter, and a heat dissipation member and disposed on a surface of the second light-transmissive member.

An optical component includes a support member having a through-hole, a second light-transmissive member disposed inside the through-hole, and having a light incidence face, a light emission face, and an outer peripheral side surface, and a heat dissipation member disposed over a surface of the second light-transmissive member.

DETAILED DESCRIPTION OF THE EMBODIMENT

Embodiments for implementing the light emitting device of the present invention will be described below with reference to the accompanying drawings. In the following embodiment of the light emitting device that embody the technological concept of the present invention are just examples, and unless otherwise specified, the constituent parts discussed in the embodiments are not intended to limit the scope of the present invention. Further, constitutions described in examples and the embodiments can be employed in other examples and embodiments.

The sizes and the arrangement relationships of the members in each of drawings are occasionally shown exaggerated for ease of explanation.

Embodiment 1: Optical Component and its Method of Manufacture

Optical Component

Figure 1A:
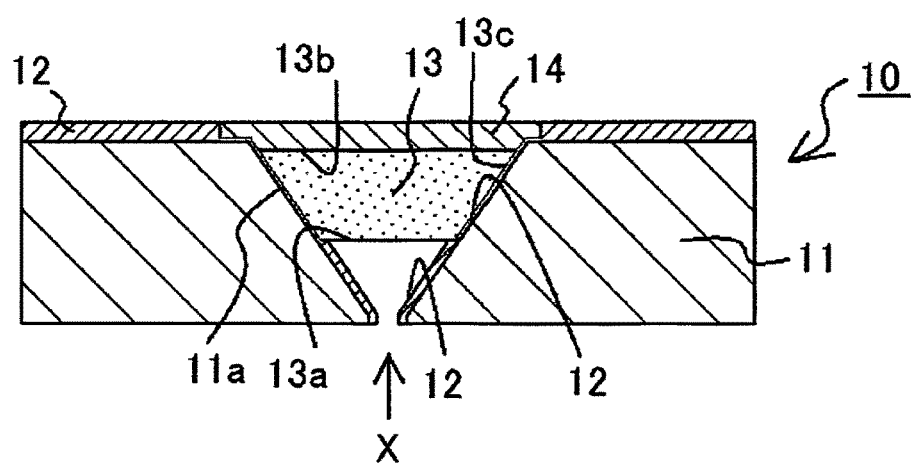
FIG. 1A is a schematic sectional view showing one embodiment of an optical component of the present invention.

As shown in FIG. 1A, the optical component 10 in this embodiment mainly includes a support member 11, a first light-transmissive member 12, and a second light-transmissive member 13. Preferably, a third light-transmissive member 14 that covers the second light-transmissive member 13 is further provided to the upper surface of the support member 11. A functional film may also be provided to one or more of the upper and/or lower surface of the first light-transmissive member 12, the third light-transmissive member 14, and the support member 11.

Support Member

The support member 11 supports the second light-transmissive member 13, and is preferably composed of a light reflective material that tends not to absorb light. The term light reflective here means that preferably the material reflects at least 50%, at least 60% at least 70% or at least 80% of the light emitted from the light source being used, such as a laser diode.

The support member 11 is preferably composed of a material with good thermal conductivity. The phrase "good thermal conductivity" here means that the thermal conductivity at 20° C. is preferably at least a few W/m·k, more preferably 10 W/m·k, still more preferably 25 10 W/m·k, and particularly preferably 50 W/m·k.

The support member 11 is preferably composed of a material with good heat resistance. The phrase "good heat resistance" here means that the melting point is preferably at least a few hundred degrees centigrade, more preferably 1000 degrees centigrade, and still more preferably 1500 degrees centigrade.

The material of the support member 11 include a ceramics such as silicon carbide, aluminum oxide, silicon nitride, aluminum nitride, titanium oxide, tantalum oxide, cermet; a refractory metal such as tungsten, tantalum, molybdenum, Kovar, or a composite thereof. It is especially preferable for the support member 11 to be formed from a material that includes aluminum oxide.

In particular, examples of materials that contain aluminum oxide include those that contain about 70 wt % aluminum oxide with respect to the total weight of the support member, and contain zirconia in an amount of about a few tenths of a weight percent to 30 wt %. This material may further contain about 0.1 to 2 wt % of one or more of yttria, calcia, magnesia, ceria as a sintering auxiliary, or a plasticizer, a solvent, or the like may be added.

There are no particular restrictions on the shape of the support member 11, and any shape may be used so long as a through-hole 11a is provided for supporting the second light-transmissive member 13 (discussed below). For instance, the support member 11 may be flat board like shape, or it may be have a box like shape, a lid like shape, ferrule like shape, or any of various other shapes.

The size and thickness of the support member 11 can be suitably set as dictated by the intended use and effect. It is especially preferable, when heat dissipation and/or strength is taken into account, for the thickness to be at least about 0.20 mm.

In the embodiment shown in FIG. 1A, the support member 11 is formed by zirconia-containing alumina (containing approximately 24% zirconia) with good thermal conductivity and heat resistance and high light reflectivity. The support member 11 here is, for example, in the form of a circular column with a diameter of 4.0 mm and a thickness of 0.67 mm.

Through-Hole

The support member 11 includes the through-hole 11a to let through light. The through-hole has an incidence opening and an emission opening. There are no particular restrictions on the shape of the through-hole 11a in the support member 11, and the hole may be formed by an inner wall having a specific diameter or width with respect to the direction X in which the light moves, or it may be formed by an inner wall that expands in the direction X in which the light moves, or the shape may be a combination of these. The spreading in the direction X in which the light moves may be sloped or may be stepped.

In FIG. 1A, the through-hole 11a is formed by an inner wall that expands in the direction X in which the light moves. Using this shape allows the return light (a part of the incident light) to be reflected by the inner wall of the through-hole, and be efficiently extract to the light emission side.

The shape of the through-hole 11a in plan view may be circular, elliptical, triangular, quadrangular, some other polyhedral shape, or a shape similar to these. Circular or substantially circular shape is particularly preferable in terms of matching the shape to the shape of light emitted from the light source. The shape of the through-hole 11a in the support member 11 is preferably columnar, truncated conical shape, a shape similar to these, or a combination of these shapes.

There are no particular restrictions on the size of the through-hole 11a, but it should be large enough to transmit at least one beam of light emitted from a laser diode. More specifically, although it will depend on the type of laser diode, the diameter or width of the hole is preferably between 0.10 and 5.0 mm. The diameter or width does not necessarily have to be constant in the direction X in which the light moves. The length of the through-hole 11a can be suitably set according to the size of the support member 11 being used. An example is about 0.20 to 10 mm.

In the embodiment shown in FIG. 1A, the through-hole 11a has a substantially circular truncated conical shape. The diameter of the hole on the light incidence side is 0.20 mm, and the diameter of the hole on the light emission side is 0.65 mm. The length of the through-hole is equal to the thickness of the support member 11.

First Light-Transmissive Member

The support member 11 has at least the first light-transmissive member 12 on the inner wall of the through-hole 11a as shown in FIG. 1. In addition, the first light-transmissive member 12 may be formed on the upper surface (light emission side) and/or the lower surface (light incidence side) of the support member.

The first light-transmissive member 12 is used to fuse the inner wall of the through-hole to the second light-transmissive member (discussed below). Accordingly, it is preferably disposed in the form of a film or a thin-film on the inner wall of the through-hole 11a.

The first light-transmissive member 12 preferably has a melting point, for example, that is lower than that of the second light-transmissive member discussed below. From another standpoint, the softening point of the light-transmissive member is preferably lower than its melting point. Furthermore, since this member is formed on the inner wall of the through-hole, it preferably does not absorb much light or has good optical transmissivity. For example, the melting point of the first light-transmissive member 12 is preferably about 1200° C. or lower, more preferably 1000° C. or lower, still more preferably 850° C., 830° C. or lower. The softening point is preferably about 1150° C. or lower, more preferably 950° C. or lower, still more preferably 850° C. or lower. The optical transmissivity of the first light-transmissive member 12 is preferably such that at least 50% of the light emitted from the light source being used (such as a laser diode) is transmitted. In particular, because the first light-transmissive member 12 functions to first melt and then bring the support member 11 into close contact with the second light-transmissive member 13 (discussed below), it is preferably formed from a material whose composition will not change after it melts and then resolidifies, and with which the same, high optical transmissivity can be maintained.

An example of the material that constitutes the first light-transmissive member 12 is an inorganic material. For instance, this member is preferably composed of borosilicate glass, soda-lime glass, soda glass, lead glass, or another such glass.

The main component of borosilicate glass is generally silicon dioxide ($SiO_2$), and further contains boron oxide (anhydrous boric acid; $B_2O_3$) and other such components. Any known type of borosilicate glass can be used. The softening point of borosilicate glass is usually between 500 and 1000° C. and preferably between 500 and 900° C.

The main component of soda-lime glass is generally silicon dioxide ($SiO_2$), sodium oxide ($Na_2O$) and/or calcium carbonate ($CaCO_3$). Any known type of soda-lime glass can be used. The softening point of soda-lime glass is usually between 600 and 800° C. and preferably between 700 and 800° C.

The main component of soda glass is generally silicon dioxide ($SiO_2$), sodium oxide ($Na_2O$) and/or potassium oxide ($K_2O$). Any known type of soda glass can be used. The softening point of soda glass is usually between 500 and 800° C. and preferably between 600 and 800° C.

The main component of lead glass is generally silicon dioxide ($SiO_2$) and lead oxide (PbO). Any known type of lead glass can be used. The softening point of lead glass is usually between 300 and 600° C. and preferably between 500 and 600° C.

The first light-transmissive member 12 is used to fix the second light-transmissive member (discussed below) by its fusing in the through-hole 11a of the support member 11. Thus, the first light-transmissive member preferably has a lower melting point and/or softening point than the material that constitutes the support member and the second light-transmissive member (discussed below). Using this first light-transmissive member allows the second light-transmissive member to be fixed to the support member. Thus, the second light-transmissive member does not need to be fixed to the support member by melting, softening, etc., so the material of the second light-transmissive member can be one that has good resistance to heat. As a result, a second light-transmissive member with stable optical characteristics can be used for light sources of higher output.

Also, since the first light-transmissive member 12 formed in a relatively thin film can be melted merely by imparting a low level of energy to the first light-transmissive member 12, The members constituting the optical component, and particularly the second light-transmissive member, can be subjected to less of a thermal load, which can make the optical characteristics more stable. As a result, optical output characteristics that are stable at a high level can be obtained.

Furthermore, since the second light-transmissive member 13 (discussed below) can be fixed snugly inside the through-hole 11a of the support member 11 by the melting of the first light-transmissive member 12, heat produced in the second light-transmissive member 13 can be efficiently released to the support member via the first light-transmissive member 12 that is-embedded in the gap and snugly affixed to the support member 11 and the second light-transmissive member 13. That is, any heat generated by the second light-transmissive member 13 or to which the second light-transmissive member 13 is subjected can be released from the side surfaces of the second light-transmissive member 13 to the support member, and efficiently dissipated.

There are no particular restrictions on the thickness of the first light-transmissive member 12, but an example is 0.01 to 5 μm on the inner wall of the through-hole, with about 0.05 to 3 μm being preferable. In the case where a portion of the first light-transmissive member 12 is formed on the upper surface of the support member 11, it may be formed thicker than on the inner wall of the through-hole, for example.

In FIG. 1A, the first light-transmissive member 12 is formed from silicon oxide. The thickness on the upper surface of the support member 11 is 6.0 μm and the thickness on the inner wall of the through-hole 11a is 1.0 μm. The softening point of the first light-transmissive member 12 is 820° C., and the optical transmissivity of light with a wavelength of 450 nm is at least 90%.

Second Light-Transmissive Member

The second light-transmissive member 13 is disposed inside the through-hole 11a of the support member 11. The second light-transmissive member 13 has a light incidence face 13a, a light emission face 13b, and an outer peripheral side surface 13c. The outer peripheral side surface 13c may, for example, have a shape such that the light incidence surface 13a side or the light emission face 13b side of the second light-transmissive member 13 is in contact with the inner wall of the through-hole 11a, but a shape that matches the shape of the through-hole 11a, that is, a shape whose surface area is larger than that of the outer peripheral side surface 13c and that is in contact with the inner wall of the through-hole 11a is preferable.

The outer peripheral side surface of the second light-transmissive member is fixed to the inner wall of the through-hole by the fusion of the first light-transmissive member, and with the above-mentioned shape, it can be fixed with the support member 11 firmly and reliably, and the heat generated by the light emitted to the second light-transmissive member 13 can be effectively released to the support member 11 side. It is particularly favorable for the second light-transmissive member to have a shape that expands from the light incidence face 13a toward the light emission face 13b. In other words, as shown in FIG. 1A, the second light-transmissive member 13 preferably has the outer peripheral side surface 13c that matches up, or substantially matches up, with the sloped surface of the truncated conical shape of the support member 11. To put this another way, the cross sectional area parallel to the light incidence face 13a and/or the light emission face 13b (perpendicular to the optical axis (discussed below)), the cross sectional area perpendicular to this, or the diameter of the second light-transmissive member preferably increases from the light incidence face 13a toward the light emission face 13b. That is, the second light-transmissive member 13 has a shape that widens from the light incidence face 13a toward the light emission face 13b.

The light incidence face 13a and the light emission face 13b are preferably flat and mutually opposed and parallel, but one or both may have a concave or convex face or a protrusion or recess. The concave or convex face may be stepped or sloped. It is particularly favorable for the light incidence face 13a and the light emission face 13b to be disposed perpendicular to an axis indicating the direction in which the light moves from the light source, that is, the optical axis.

The size of the second light-transmissive member 13 can be suitably adjusted according to the above-mentioned through-hole 11a. For instance, in plan view, the member should be large enough to allow at least one beam of the light emitted from the laser diode to be transmitted. More specifically, although it will depend on the type of laser diode, the diameter or width is preferably within a range of 0.10 to 3.0 mm. The diameter or width does not necessarily have to be constant in the direction X in which the light moves. The thickness of the second light-transmissive member 13 can be suitably set according to the size of the support member 11 being used. An example is about 0.20 to 10 mm. This can afford a good heat dissipation effect by having the outer peripheral side face 13c of the second light-transmissive member 13 be in contact with the support member 11.

The second light-transmissive member 13 is preferably formed from a material with good optical transmissivity. For example, the optical transmissivity is preferably such that at least 50%, and more preferably at least 60%, and even more preferably at least 70% or at least 80%, of the light emitted from the light source being used (such as a laser diode) is transmitted. Also, it is preferably formed from a material with good resistance to heat and light, which will not be degraded, etc., even when irradiated with high-output light. An example is a melting point between 1000° C. and 3000° C., and preferably 1300° C. and 2500° C., and more preferably 1500° C. and 2000° C.

An example of the material of the second light-transmissive member is a ceramic. More specifically, examples include aluminum oxides such as alumina and sapphire ($Al_2O_3$, melting point: about 1900° C. to 2100° C.), silicon dioxide such as quartz glass ($SiO_2$, melting point: about 1500° C. to 1700° C.), zirconium oxide ($ZrO_2$, melting point: about 2600° C. to 2800° C.), barium oxide (BaO, melting point: 1800° C. to 2000° C.), titanium oxide ($TiO_2$, melting point: 1700° C. to 1900° C.), yttrium oxide ($Y_2O_3$, melting point: 2425° C.), silicon nitride ($Si_3N_4$, melting point: 1900° C.), aluminum nitride (AlN, melting point: 2200° C.), silicon carbide (SiC, melting point: 2730° C.). These may be used alone or in combinations of two or more types. From the standpoint of light-transmissiveness, melting point, thermal conductivity, diffusivity, and so forth, the material preferably contains aluminum oxide or silicon dioxide, with one that contains aluminum oxide being particularly preferable.

The second light-transmissive member may have either a single-layer structure or a multi-layered structure, made of just one material or of a plurality of materials.

In the case where the second light-transmissive member is formed from such materials described above, then even when the second light-transmissive member rises to a high temperature because the light source (such as a laser diode) has a high output, the second light-transmissive member itself will be less likely to melt, and this in turn can avoid discoloration and distortion of the second light-transmissive member. Thus, the optical characteristics can be maintained without deteriorating for a long period of time. Also, using a material with good thermal conductivity allows any heat attributable to the light source to be efficiently dissipated.

As long as the melting point of the second light-transmissive member is higher than that of the first light-transmissive member 12, it may be the same as, lower than, or higher than that of the support member 11, although it is preferably higher.

The second light-transmissive member 13 preferably further contains a phosphor. This allows the wavelength of the light emitted from the light source to be converted, and allows mixed-color light that is a mixture of the light from the light source and wavelength-converted light to be emitted to the outside.

The phosphor can be any known type, as long as the wavelength of the light emitted by the light source being used, the color of the light to be obtained, and other such considerations are taken into account, for example. Examples of the phosphor include yttrium-aluminum-garnet (YAG)-based phosphors activated by cerium, lutetium-aluminum-garnet (LAG)-based phosphors activated by cerium, nitrogen-containing calcium aluminosilicate (CaO—$Al_2O_3$—$SiO_2$)-based phosphors activated by europium and/or chromium, silicate (($Sr,Ba)_2SiO_4$)-based phosphors activated by europium, β-SiAlON phosphors and KSF-based phosphors ($K_2SiF_6$:Mn). Among these, the phosphors having high heat resistance is preferred.

These phosphors can be used to obtain a light emitting device that emits mixed-color light (such as white light) consisting of primary and secondary light with a visible wavelength, or a light emitting device that emits secondary light with a visible wavelength upon excitation with primary light (ultraviolet light). It is particularly favorable to use a phosphor that is excited by blue light and emits a broad spectrum of yellow light, as a phosphor that emits white light in combination with a blue light emitting element.

A number of different types of phosphor may be used in combination. Examples thereof include $Si_{6-z}Al_zO_zN_{8-z}$:Eu, $Lu_3Al_5O_{12}$:Ce, $BaMgAl_{10}O_{17}$:Eu, $BaMgAl_{10}O_{17}$:Eu,Mn, (Zn,Cd)Zn:Cu, $(Sr,Ca)_{10}(PO_4)_6C_{12}$:Eu, Mn, $(Sr,Ca)_2Si_5N_8$:Eu, $CaAlSiB_xN_{3+x}$:Eu, $K_2SiF_6$:Mn and $CaAlSiN_3$:Eu. The color rendering and color reproducibility can be adjusted by using phosphors in a combination and blend ratio suited to the desired coloring.

The phosphors may be used in combination in a second light-transmissive member with a single-layer structure, or the different phosphors may be each contained in a second light-transmissive member with a stacked structure.

The phosphor is preferably one having a relatively large average particle size. For example, the average particle size (median size) is preferably at least 10 μm, and more preferably at least 12 μm, as well as the average particle size is preferably 50 μm or less, more preferably 30 μm or less, and still more preferable 25 μm or less. The average particle size here refers to the particle size measured by the air permeability method with a Fisher Sub-Sieve Sizer. Thus using a phosphor having a relatively large average particle size can reduce the amount of heat generated by light from the light source, and also can make it easier to dissipate heat from the second light-transmissive member.

An amount of the phosphor can be 0.05 to 50 wt %, and more preferably 1 to 15 wt %, for example, with respect to the total weight of the second light-transmissive member.

The second light-transmissive member may include a light scattering material as needed. This light scattering material should either have a higher melting point and a different refractive index as compared to the other materials constituting the second light-transmissive member. Aluminum oxide, silicon oxide, titanium oxide, and the like can be used, for example, as the light scattering material. There are no particular restrictions on the amount in which the light scattering material is contained, but it can be used in an amount that is smaller than that of the material of the second light-transmissive member being used, for example.

The second light-transmissive member may optionally have a functional film formed on the light incidence face 13a and/or the light emission face 13b. For instance, an anti-reflective layer (AR layer) or the like may be formed. These layers can be disposed as a single-layer or a multi-layered structure, and made from materials that are known in this field.

In the embodiment shown in FIG. 1A, the second light-transmissive member 13 is made from aluminum oxide (melting point of approximately 1900 to 2100° C.) containing 11 wt % YAG (as a phosphor) with respect to the total weight of the second light-transmissive member. The second light-transmissive member 13 has a diameter of 0.50 mm on its upper surface, a diameter of 0.30 mm on its lower surface, and a thickness of 0.30 mm. The second light-transmissive member 13 is made to fit snugly against the support member 11 by the melting of the first light-transmissive member 12, but the second light-transmissive member 13 itself does not melt.

Third Light-Transmissive Member

The third light-transmissive member is preferably disposed so as to cover at least the light emission face of the second light-transmissive member. In one embodiment, the third light-transmissive member is disposed so as to reach from the light emission face 13b of the second light-transmissive member 13 to the first light-transmissive member 12 disposed on the support member 11, and to cover these.

The third light-transmissive member 14 is preferably formed from the above-mentioned light-transmissive material. For example, it can be selected from among the materials listed as examples for the first light-transmissive member 12.

The melting point of the third light-transmissive member may be the same as, higher than, or lower than that of the first light-transmissive member. The third light-transmissive member preferably has a melting point lower than that of the second light-transmissive member 13. The third light-transmissive member also preferably has a melting point lower than that of the support member 11.

The third light-transmissive member can be fixed to the support member 11 by utilizing its own melting and/or by utilizing the melting of the first light-transmissive member.

The third light-transmissive member 14 is preferably formed by fusion (melting). Forming by fusion ensures a large contact surface area as well as a snug fit between the third light-transmissive member and the second light-transmissive member, that is, without any air gaps or the like between the third light-transmissive member and the second light-transmissive member.

The third light-transmissive member 14 preferably contains the above-mentioned phosphor and/or a light scattering material or filler. This allows the light passing through the second light-transmissive member to be made more uniform, or allows for color adjustment. Also, depending on the type of phosphor, in the case where there may be poor miscibility or the like with the material constituting the second light-transmissive member, or there may be deterioration in the manufacture of the second light-transmissive member, etc., by containing a phosphor in the third light-transmissive member 14 instead of containing a phosphor in the second light-transmissive member, or containing a light scattering material or a filler in the third light-transmissive member 14 instead of containing a light scattering material or a filler in the second light-transmissive member, even more stable optical characteristics can be obtained. Also, it may be less likely that local transmissivity will suffer in the second light-transmissive member, while it will be possible to use a larger quantity of light scattering material or filler in the third light-transmissive member. Furthermore, by using a larger quantity of light scattering material or filler in the third light-transmissive member, the light may emit on the phosphor of the second light-transmissive member in a state in which the light density has been reduced, and it can be reduced heat generated at the phosphor and color unevenness in the emitted light. Also, the third light-transmissive member can adjust the light emitted from the second light-transmissive member and/or incident on the second light-transmissive member to the desired color.

The content of the phosphor and/or light scattering material in the third light-transmissive member 14 may be, for example, 1.0 to 20 wt %, and preferably 2.0 to 10 wt %, for each, with respect to the total weight of the third light-transmissive member.

The thickness of the third light-transmissive member 14 may be about a few microns to a few hundred microns, for example.

In FIG. 1A, the third light-transmissive member 14 is formed from glass that contains silicon dioxide as a light scattering agent in an amount of 4.0 wt % with respect to the total weight of the third light-transmissive member. The surface of the third light-transmissive member 14 is either flush with the surface of the first light-transmissive member 12, or is disposed slightly higher than the surface of the first light-transmissive member 12.

Functional Film

There are no particular restrictions on the functional film, so long as it is a film that can function well in terms of light transmission, reflection, heat conduction, and so forth, but examples include a short pass filter, a long pass filter, and a heat dissipation member. Depending on their function, these can be disposed in the direction of light movement or intersecting the direction of light movement, on the light emission face side or incidence side.

Method for Manufacturing Optical Members

The method for manufacturing the optical component 10 in this embodiment includes the following steps, as shown in FIGS. 1B to 1E.

(a) Prepare a support member in which a through-hole is formed and which has an incidence opening and an emission opening, (b) Prepare a second light-transmissive member that has a light incidence face, a light emission face, and an outer peripheral side face, (c) Form a first light-transmissive member on the inner wall of the through-hole, and (d) Fix the outer peripheral side surface of the second light-transmissive member to the inner wall of the through-hole by fusion of the first light-transmissive member.

Steps (a) to (c) may be performed in any order.

After step (d), an optional step (e) may be performed in which a third light-transmissive member is formed that reaches from the emission face of the second light-transmissive member to the first light-transmissive member and covers these.

It is also possible to include a step (f) in which one or more of the upper surfaces and/or lower surfaces of the third light-transmissive member, the first light-transmissive member, and the support member are polished, etc.

a: Preparation of Support Member

Figure 1B:
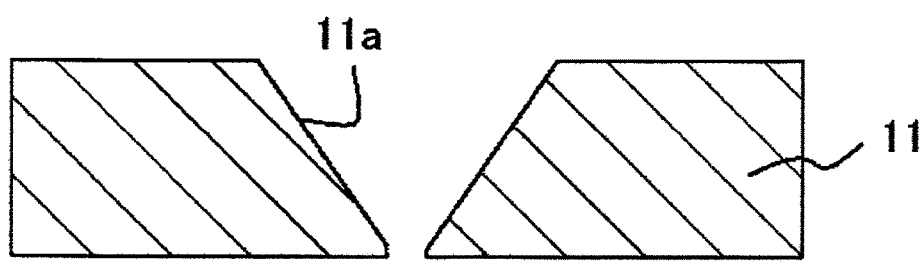
FIGS. 1B to 1E are schematic cross-sectional process views of a method of manufacturing the optical component of FIG. 1A.

In this step, the support member is prepared. For example, a ceramic made from a material that will become the support member is readied. As shown in FIG. 1B, this flat ceramic piece is cut to the appropriate size, and the through-hole 11 which has an incidence opening and an emission opening is formed so as to extend in one direction. The through-hole 11a can be formed by any method known in this field. For example, it is formed by grinding or molding in a metal mold.

For instance, in the case where a ceramic sheet is prepared from the above-mentioned aluminum oxide that contains zirconia, 70 to 95 weight parts aluminum oxide and 5.0 to 30 weight parts zirconia are mixed with 0.1 to 2.0 weight parts of one or more of yttria, calcia, magnesia, and ceria, and this mixture is made into a ceramic green sheet with a specific thickness. This ceramic green sheet is molded into a specific shape in a metal mold, and is fired at about 1550° C.

b: Preparation of Second Light-Transmissive Member

In this step, the second light-transmissive member is prepared. For example, a sheet is prepared from a material that will become the second light-transmissive member. The material that will become the second light-transmissive member may contain a phosphor and, optionally, a light scattering material or a filler.

For instance, in the case where a ceramic sheet is prepared from aluminum oxide, a material whose main component is aluminum oxide is optionally mixed with additives, a phosphor, a light scattering agent, or the like, and the mixture thus obtained is sintered by solid compression sintering.

More specifically, an example is a discharge plasma sintering method in which the resulting mixture is packed into a graphite sintering mold, a large current is applied by utilizing on-off DC pulse voltage/current, a high-energy discharge plasma instantaneously generated by spark discharge (a high-temperature plasma in which high-temperature sites of from a few thousand to 10,000° C. are instantaneously produced between particles), is applied directly to the sintering mold and the material while pressure is applied.

Figure 1C:
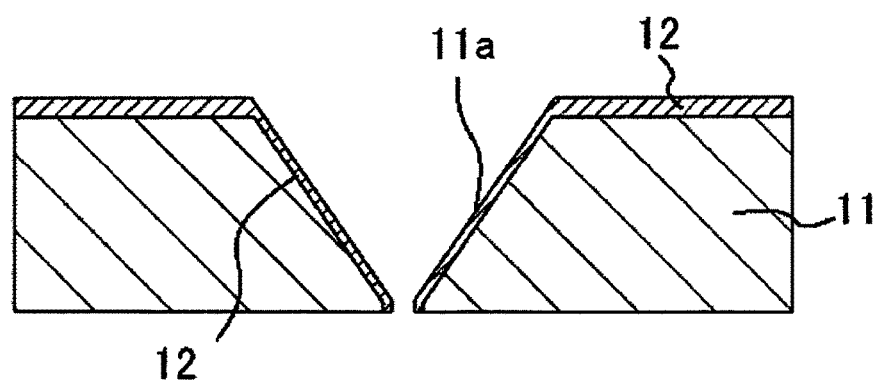
Figure 1D:
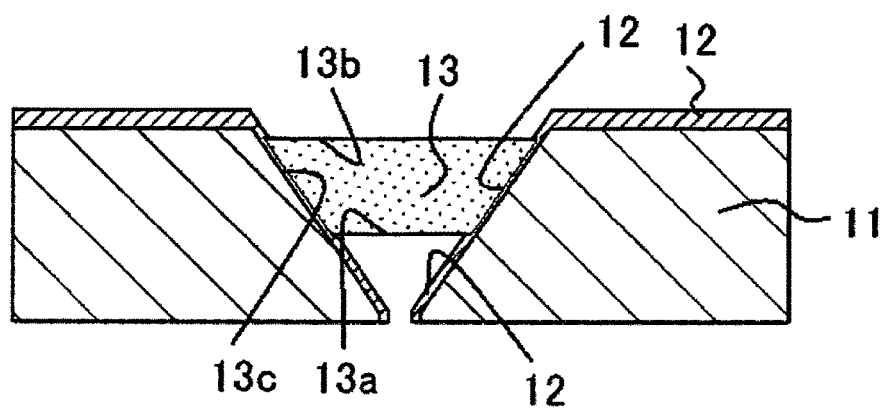

After this, the product is ground down to the proper size to produce an appropriate outer peripheral side surface (see 13 in FIG. 1D).

c: Formation of First Light-Transmissive Member

As shown in FIG. 1C, the first light-transmissive member 12 is formed on the inner wall of the through-hole 11a of the support member 11. As long as the first light-transmissive member 12 is formed on all or part of the inner wall of the through-hole 11a, it may also be formed on the upper surface of the support member, etc.

The first light-transmissive member 12 can be formed on the support member 11 by a known method such as sol-gel method, spin coating, or sputtering, for example. Of these, sputtering is especially favorable.

An example is a method in which a target composed of borosilicate glass is used, and a film is formed by sputtering with a sputtering device.

d: Fixing of Second Light-Transmissive Member

As shown in FIG. 1D, the second light-transmissive member 13 is disposed, conforming to the shape of the through-hole 11a, inside the through-hole 11a of the support member 11, on the surface of the inner wall of which the first light-transmissive member 12 is formed. After this, the first light-transmissive member 12 is melted by a processing that entails heating, at the sites where the second light-transmissive member 13 and the support member 11 are in contact via the first light-transmissive member 12.

This heating is done at a temperature above the melting point (or softening point) of the first light-transmissive member, and below the melting point of the second light-transmissive member. More specifically, an example is a method in which the heating is done at a temperature of about 750 to 850° C. In particular, in the case where the support member is formed from aluminum oxide containing zirconia, and the second light-transmissive member is formed from aluminum oxide, the heating is preferably done at a temperature of about 820 to 830° C., which softens or melts only the first light-transmissive member, without melting the second light-transmissive member or the support member. With this process, the second light-transmissive member and the support member can be fused over the contact surfaces of the second light-transmissive member and the support member, and the gaps filled in. The heating is preferably performed by using an electric furnace, for example.

After the first light-transmissive member is melted, the second light-transmissive member may be pressed against the support member, which can fit the two snugly together, and these are then cooled to solidify the first light-transmissive member, which can fix the second light-transmissive member inside the through-hole of the support member.

By thus disposing the first light-transmissive member on the surface of the inner wall, the second light-transmissive member and the support member can be fused with good reproducibility, without having to position the two. Also, since the fusion and fixing to the support member can be accomplished over a large surface area that utilizes the outer peripheral side surface of the second light-transmissive member, the second light-transmissive member can be securely fixed to the support member, and because of the snug fit, the heat of the second light-transmissive member can be efficiently propagated and dissipated to the support member. As a result, the heat dissipation of a light emitting device in which this optical component is used can be further improved.

e: Formation of Third Light-Transmissive Member

Figure 1E:
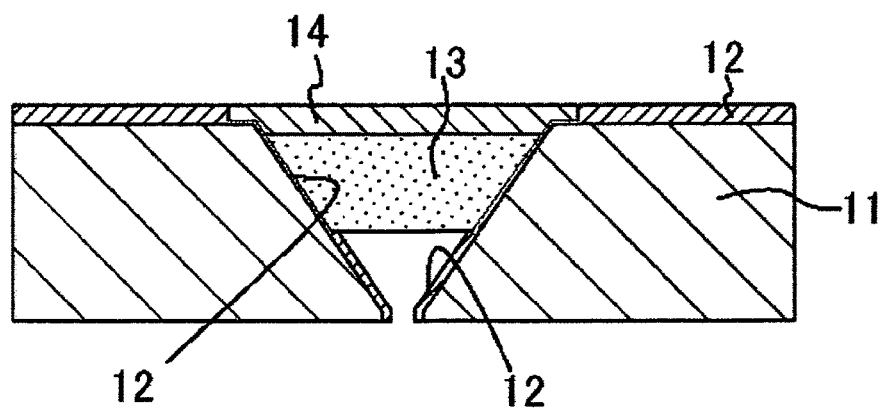

As shown in FIG. 1E, after the second light-transmissive member is fixed to the support member, the third light-transmissive member 14 may optionally be formed so as to cover the second light-transmissive member 13 with the third light-transmissive member 14.

To form the third light-transmissive member, for example, the third light-transmissive member 14, is molded or worked to a size that is slightly larger than the size of the through-hole 11a on the emission side of the support member 11, and this is disposed so as to reach from the light emission face of the second light-transmissive member 13 to the first light-transmissive member 12, a treatment involving heating is performed, and the third light-transmissive member 14 is melted. Alternatively, a third light-transmissive member 14 of substantially the same size as the light emission face may be used.

In this case, the first light-transmissive member 12 formed on the surface of the support member 11 may be melted along with the melting of the third light-transmissive member 14.

After the third light-transmissive member 14 is melted, the third light-transmissive member 14 may be pressed against the support member 11 to fit them snugly together, and these may be cooled to solidify the third light-transmissive member 14 and fix it to the support member 11 and/or the second light-transmissive member 13.

Alternatively, a mask may be used, for example, so that the third light-transmissive member 14 is formed partially on the light emission face of the second light-transmissive member 13 or at positions reaching from the light emission face of the second light-transmissive member 13 to the first light-transmissive member 12, by sputtering, a sol-gel method, vapor deposition, ALD, or another such method.

After the third light-transmissive member 14 is fixed, its upper surface may be polished. This polishing adjusts the volume of the third light-transmissive member. In the case where the third light-transmissive member contains a phosphor and/or a light scattering material or filler, the uniformity of light that passes through the second light-transmissive member can be adjusted and/or the color can be adjusted by adjusting the volume of the third light-transmissive member. This polishing may remove a portion of the third light-transmissive member 14 along with the first light-transmissive member 12 remaining on the support member 11, and may make the upper surfaces of the third light-transmissive member 14 and the support member 11 substantially flush. Alternatively, the upper surfaces of the remaining first light-transmissive member 12 and the third light-transmissive member 14 may be made substantially flush. Also, after the third light-transmissive member 14 is fixed, its upper surface may be roughened to give it texture.

Embodiment 2: Optical Component and its Method of Manufacture

Figure 2:
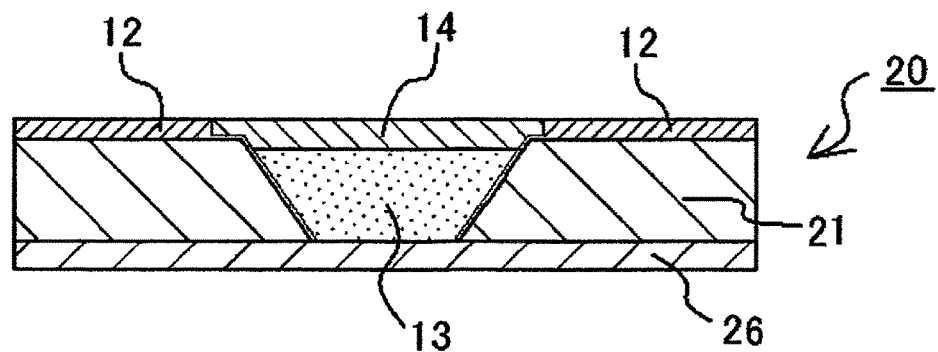
FIGS. 2 to 5 are schematic sectional views showing each embodiment of an optical component of the present invention.

As shown in FIG. 2, the optical component 20 in this embodiment mainly includes a support member 21, a first light-transmissive member 12, a second light-transmissive member 13, a third light-transmissive member 14, and a filter 26 as a functional film that transmits light whose wavelength is the same as or shorter than the wavelength of the light emitted by the light emitting elements of a light emitting device, and reflects light with a longer wavelength.

The filter 26 can be any one formed from a material that is known in this field.

As shown in FIG. 2, the filter 26 is disposed in contact with the support member 11 and the second light-transmissive member 13, on the light incidence face side of the second light-transmissive member 13. Therefore, after the third light-transmissive member 14 is formed, the lower surface of the support member 11 is polished and the filter 26 is formed by sputtering, for example. An inorganic adhesive, vapor deposition, or the like may also be used.

Other than the above configuration, the optical component 20 is substantially the same as the optical component 10 and can be formed by substantially the same manufacturing method.

With this configuration, in addition to the effect obtained with the optical component 10, the use of the filter 26 allows just the light of the desired wavelength to be selectively and efficiently extracted.

Embodiment 3: Optical Component and its Method of Manufacture

Figure 3:
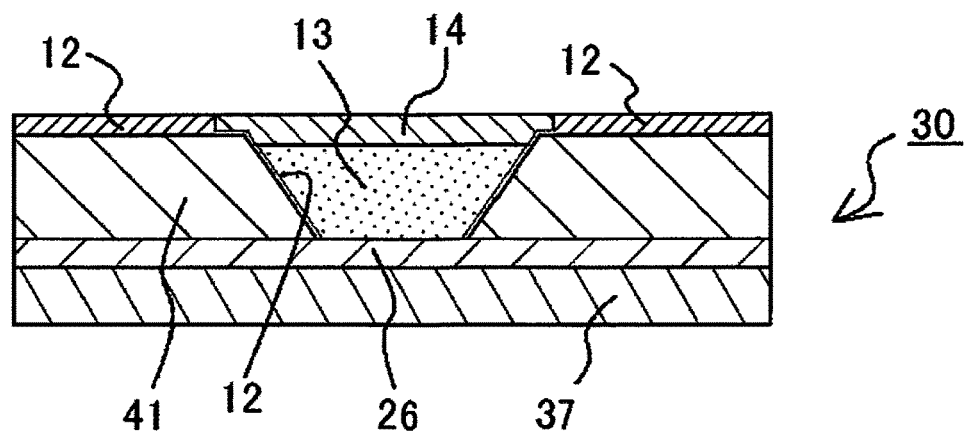

As shown in FIG. 3, the optical component 30 in this embodiment mainly includes a support member 41, a first light-transmissive member 12, a second light-transmissive member 13, a third light-transmissive member 14, a filter 26, and a heat dissipation member 37.

There are no particular restrictions on the heat dissipation member so long as it is made from a light-transmissive material and has good heat resistance, and the materials listed as examples for the first light-transmissive member, the second light-transmissive member, and the third light-transmissive member can be used, sapphire, and the like.

The heat dissipation member can be bond to the filter 26 by a low-melting point glass, for example.

Other than the above configuration, the optical component 30 is substantially the same as the optical components 10 and 20 and can be formed by substantially the same manufacturing method.

With this configuration, in addition to the effect obtained with the optical components 10 and 20, just light of the desired wavelength can be selectively and efficiently extracted, and the filter 26 can draw off heat not only from the support member 11, but also from the entire surface on the opposite side thereof, so heat dissipation properties can be improved.

Embodiment 4: Optical Component and its Method of Manufacture

Figure 4:
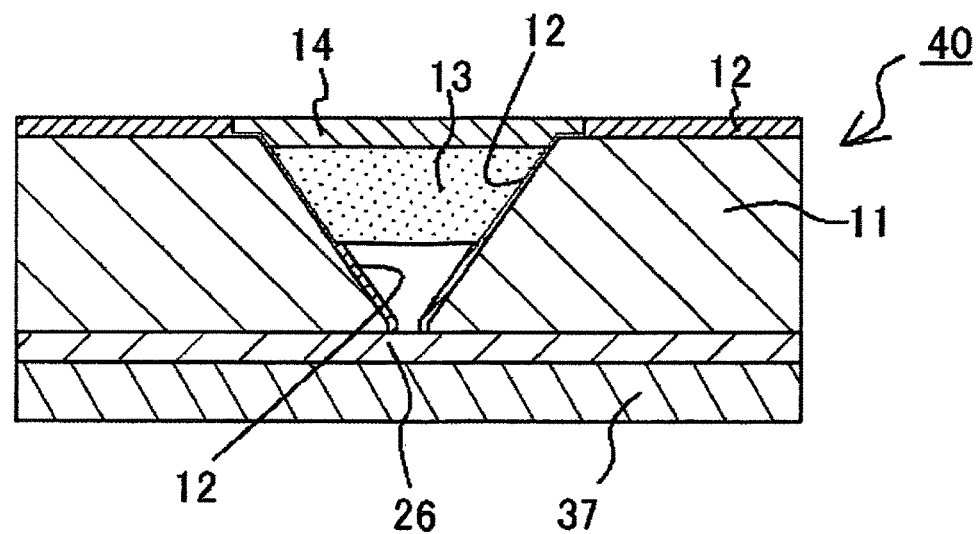

As shown in FIG. 4, the optical component 40 in this embodiment, which is a modification example of Embodiment 3, is similar to the optical component 30 in FIG. 3 in that it mainly includes a support member 11, a first light-transmissive member 12, a second light-transmissive member 13, a third light-transmissive member 14, a filter 26, and a heat dissipation member 37. The filter 26 and the second light-transmissive member 13 may be separated from each other.

More specifically, in Embodiment 2, after the third light-transmissive member 14 is formed, the filter 26 is formed by sputtering or the like on the lower surface of the support member 11, without polishing this lower surface first. The filter 26 is disposed in contact with the support member 11 and separated from the second light-transmissive member 13, on the light incidence face side of the second light-transmissive member 13.

Embodiment 5: Optical Component

Figure 5:
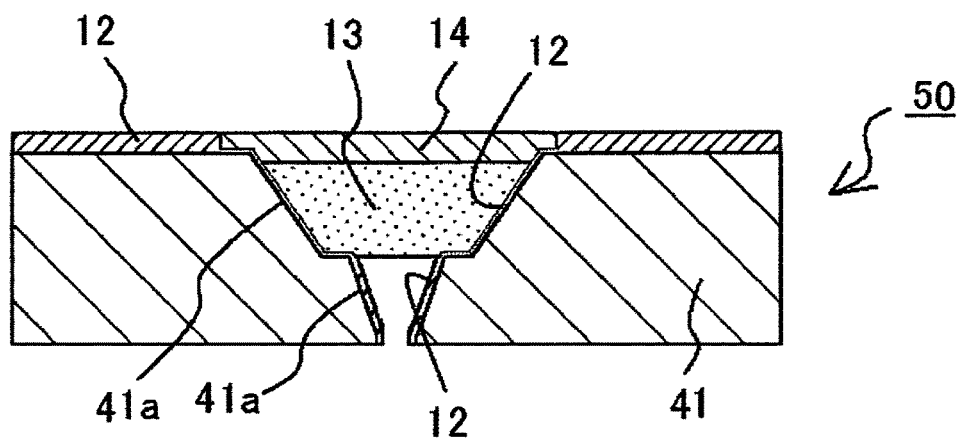

As shown in FIG. 5, the optical component 50 in this embodiment has substantially the same configuration as the optical component 10, except that a through-hole 41a of a support member 41 has a shape that widens in steps and at an angle in the direction in which the light moves, and can be formed by substantially the same manufacturing method.

With this configuration, the second light-transmissive member 13 can be snugly fitted not only to the outer peripheral side surface, but also to the support member 11 on part of the light emission face, so more secure fixing is achieved and better heat dissipation from the second light-transmissive member 13 can be obtained.

Embodiment 6: Light Emitting Device and its Method of Manufacture

The light emitting device 60 in this embodiment is produced by combining any of the above-mentioned optical components with a light source, etc. That is, the light emitting device can be manufactured by connecting the optical component to a light source. In this case, "connecting" may not mean a direct connection to a semiconductor laser element, and instead means that the light emitted from the light source is optically linked so as to emit to the second light-transmissive member in the support member of the optical component.

Figure 6A:
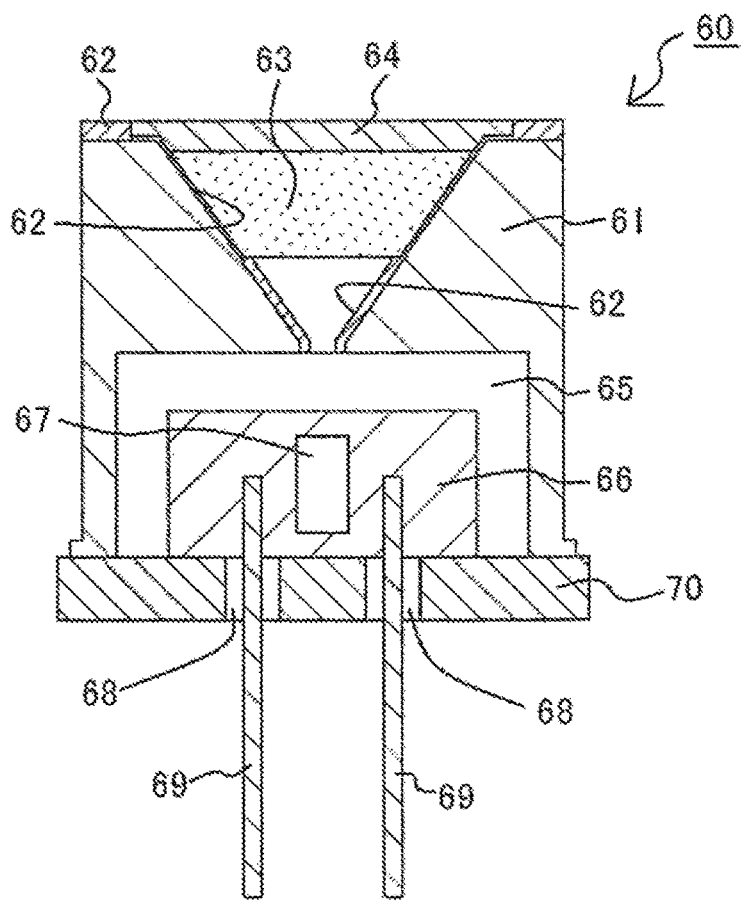
FIG. 6A is a schematic sectional view showing one embodiment of a light emitting device of the present invention.

As shown in FIG. 6A, this light emitting device 60 mainly includes a semiconductor laser element as a light source (that is, a laser diode 67), and an optical component including a support member 61.

The light source is not limited to a laser diode, and can be any of a variety of things, such as a light emitting diode.

There are no particular restrictions on the laser diode 67, so long as it is able to generate a laser beam. A peak wavelength of the laser diode can be 300 nm to 500 nm, preferably 400 nm to 470 nm, more preferably 420 to 470 nm. An edge-emitting laser diode can be used. A high-output laser diode can be used. For example, a single laser diode can have an output of from 1 to 100 W. Also, just one laser diode may be used, or two or more may be used to obtain a higher output in one device. In case where two or more laser diodes are used, their wavelengths may be within the same wavelength band, or they may be different, or they may overlap.

This light emitting device 60, as discussed above, includes an optical component having good resistance to heat, so it is particularly preferable when a high-output laser diode is employed.

The support member 61 of the optical component is in the form of a cylindrical casing, has a through-hole, and a second light-transmissive member 63 is fused to the inner wall of the through-hole by a first light-transmissive member 62. A third light-transmissive member 64 is fixed all the way from on the second light-transmissive member 63 to on the first light-transmissive member. Other than this configuration, the optical component is configured substantially the same as the optical component 10.

The laser diode 67 is fixed to a plate like stem 70 with a heat sink 66. The support member 61 includes an internal space 65, and the internal space 65 is sealed off by the stem 70. The stem 70 has a plurality of leads 69 for electrically connecting to external power, with the leads 69 disposed through a plurality of through-holes provided to the stem 70. The through-holes can be sealed off by a sealing material 68 made of a material such as low-melting point glass. The laser diode 67 is electrically connected to the leads 69 via wires or other such conductive members.

A lens or other such member capable of converging laser light, for example, may be provided between the laser diode 67 and the support member 61, and particularly the second light-transmissive member 63.

Figure 6B:
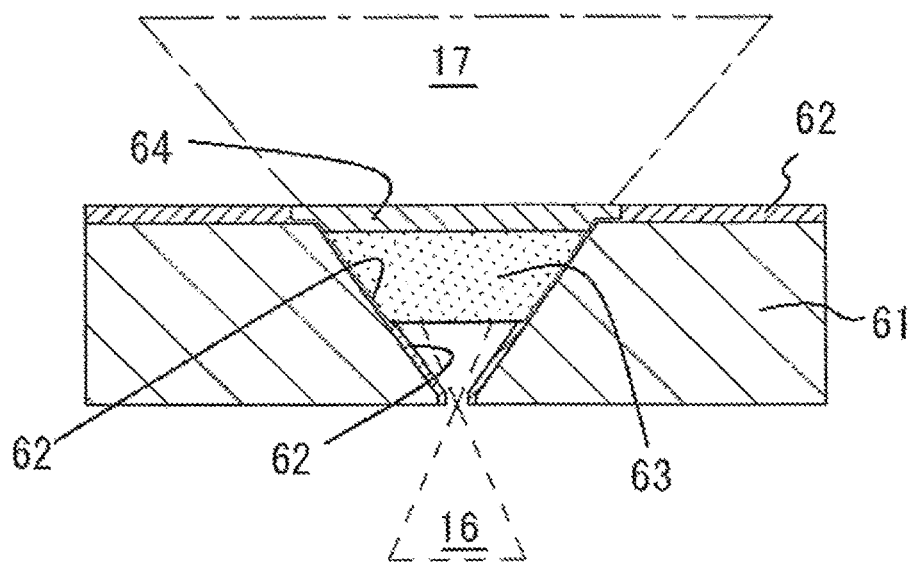
FIG. 6B is an enlarged schematic cross-sectional view for describing the passage of light in the optical components of the light emitting device of FIG. 6A.

As shown in FIG. 6B, with the light emitting device having this configuration, light emitted from the laser diode 67 can pass through the through-hole of the support member 61 as incident light 16, is shined on the second light-transmissive member 63, and is emitted as emission light 17 through the third light-transmissive member 64.

Consequently, the light can be converted to the desired wavelength by the second light-transmissive member 13, and light that passes through the second light-transmissive member 63 can be made more uniform, and the light with adjusted color can be obtained.

Also, in long-term illumination, the optical component itself may not undergo any deterioration or depredation, so uniform optical quality characteristics can be maintained or improved over an extended period.

Also, with the support member 11, in the case where there is no silver-containing cover film in the direction in which the light moves, the light extraction efficiency for high-output light can be maintained over an extended period of time. Furthermore, even when the second light-transmissive member and/or the third light-transmissive member contains a phosphor, since the heat dissipation of these light-transmissive members is improved, the optical quality characteristics can be maintained without adversely affecting the phosphor.

Embodiment 7: Light Emitting Device

Another example of a light emitting device is one in which a light source, a lens that converges the light from the light source, a connector for connecting the light from the light source to an optic fiber, an optic fiber, a distal end member that supports the distal end portion of the optic fiber, and an optical component connected to the distal end member are linked in that order. With this light emitting device, part of the light from the light source is introduced by the optic fiber to the optical component, and can be extracted from the optical component as mixed-color light consisting of light from the light source and light from the phosphor.

The optical component in an embodiment of the present invention affords even higher output and brightness. This optical component is also less likely to be degraded when used for an extended period of time, so high quality can be maintained over an extended period.

Also, with the method for manufacturing the optical component in an embodiment of the present invention, a high-quality optical component can be manufactured simply and reliably, without entailing any special steps, and without driving up the manufacturing cost.

Furthermore, the light emitting device and its manufacturing method in an embodiment of the present invention afford high reliability with which quality can be maintained for an extended period while still offering high output and brightness, and allow a high-quality produced to be manufactured simply and reliably.

INDUSTRIAL APPLICABILITY

The optical component and the light emitting device of the present invention can be used for backlight light sources of liquid crystal displays, various kinds of lighting fixtures, and various kinds of display devices such as large displays, advertisements and destination guides, and image reading devices in digital video cameras, facsimiles, copiers, scanners and the like, and projector devices.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. An optical component comprising:
a support member having a through-hole;
a second light-transmissive member disposed inside the through-hole, and having a light incidence face, a light emission face, and an outer peripheral side surface;
a heat dissipation member made of sapphire, and disposed below a lower most part of the support member, the heat dissipation member being thermally in contact with the support member; and
at least one functional film disposed between the support member and the heat dissipation member, the at least one functional film being spaced apart from the second light-transmissive member.

2. The optical component according to claim 1, wherein the second light transmissive member contains a phosphor which converts wavelength of light emitted from light source.

3. The optical component according to claim 1, wherein the second light-transmissive member is made of ceramic.

4. The optical component according to claim 3, wherein the second light-transmissive member contains a phosphor which converts wavelength of light emitted from light source.

5. The optical component according to claim 1, further comprising
a third light-transmissive member that covers the light emission face of the second light-transmissive member.

6. The optical component according to claim 5, wherein the third light-transmissive member includes a phosphor.

7. The optical component according to claim 5, wherein the third light-transmissive member includes a filler.

8. The optical component according to claim 1, wherein a lower surface of the second light-transmissive member is spaced apart from a lower surface of the support member.

9. The optical component according to claim 1, wherein the functional film is a filter.

10. The optical component according to claim 4, further comprising
a third light-transmissive member that covers the light emission face of the second light-transmissive member.

11. The optical component according to claim 10, wherein the third light-transmissive member includes a phosphor.

12. The optical component according to claim 10, wherein the third light-transmissive member includes a filler.

13. The optical component according to claim 4, wherein a lower surface of the second light-transmissive member is spaced apart from a lower surface of the support member.

14. The optical component according to claim 5, wherein a lower surface of the second light-transmissive member is spaced apart from a lower surface of the support member.

15. The optical component according to claim 6, wherein a lower surface of the second light-transmissive member is spaced apart from a lower surface of the support member.

16. The optical component according to claim 7, wherein
a lower surface of the second light-transmissive member
is spaced apart from a lower surface of the support
member.

17. The optical component according to claim 10, wherein
a lower surface of the second light-transmissive member
is spaced apart from a lower surface of the support
member.

18. The optical component according to claim 11, wherein
a lower surface of the second light-transmissive member
is spaced apart from a lower surface of the support
member.

19. The optical component according to claim 12, wherein
a lower surface of the second light-transmissive member
is spaced apart from a lower surface of the support
member.

\* \* \* \* \*